(12) United States Patent
Yang et al.

(10) Patent No.: US 6,429,152 B1
(45) Date of Patent: Aug. 6, 2002

(54) METHOD OF FORMING A THIN FILM ON A SEMICONDUCTOR WAFER

(75) Inventors: Neng-Hui Yang; Ming-Sheng Yang, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/885,043

(22) Filed: Jun. 21, 2001

(51) Int. Cl.[7] .............................................. H01L 21/477
(52) U.S. Cl. ....................... 438/798; 438/795; 438/799; 438/788
(58) Field of Search ................................ 438/758, 778, 438/787, 788, 795, 799, 798

(56) References Cited

U.S. PATENT DOCUMENTS 5,484,749 A * 1/1996 Maeda et al. ............... 438/788
5,893,760 A * 4/1999 Mikata et al. ............... 438/795
6,218,320 B1 * 4/2001 Lu et al. ...................... 438/788

* cited by examiner

Primary Examiner—Trung Dang
(74) Attorney, Agent, or Firm—Winston Hsu

(57) ABSTRACT

A method is given to form a thin film on a surface of a semiconductor wafer. The surface has at least a first region, containing an inner portion of the wafer, and a second region, containing an outer portion of the wafer, and slopes outward from the first region to the second region. The method starts with performing an in-situ inert gas plasma treatment on the surface of the semiconductor wafer to generate different temperatures from the first region to the second region. Different deposition rates of a precursor A from the first region to the second region are thus generated so as to form a flat surface. Then a precursor A-chemical vapor deposition (CVD) process is performed to form the thin film with the flat surface immediately after performing the inert gas plasma treatment.

19 Claims, 1 Drawing Sheet

METHOD OF FORMING A THIN FILM ON A SEMICONDUCTOR WAFER

BACKGROUND OF THE INVENTION

1. Field of the Invention

The present invention relates to a method of forming a thin film on a semiconductor wafer, and more specifically, to a method of forming a thin film with a flat surface on a semiconductor wafer.

2. Description of the Prior Art

Silicon oxide, having a proper dielectric constant and excellent cohesion to silicon surfaces is commonly used in gate oxides, local oxidation of silicon (LOCOS), field oxides, interlayer dielectrics, pad oxides, etc. As the integration density of the electrical devices fabricated on the wafer increases, the standard for the quality and the step coverage ability of the silicon oxide becomes more rigid.

There are three commonly adopted methods for forming a silicon oxide film on a surface of a semiconductor wafer: (1) chemical vapor deposition (CVD), (2) thermal oxidation, and (3) spin-on glass (SOG). The CVD processes include silane low-pressure chemical vapor deposition ($SiH_4$-LPCVD), tetra-ethyl-ortho-silicate low-pressure chemical vapor deposition (TEOS-LPCVD), plasma-enhanced chemical vapor deposition (PECVD), etc. Generally a silicon oxide film formed by the CVD process has better step coverage ability. The CVD process involves changing reactants to solid products through chemical reactions in a chamber, and is one of the most important tools commonly applied in the semiconductor industry. Since the CVD process involves producing films through chemical reactions among gas reactants, the crystallinity and the stoichiometry of the films are better than that of the films produced by sputtering.

However, the thickness uniformity of the thin film, especially thin films composed of large molecule precursors, formed by the PECVD process is easily affected by the operating temperature of the PECVD process so as to reduce yield rates in subsequent processes. This negative effect is normally compensated by adjusting parameters of the PECVD process, including gas flow rate, pressure or showerhead spacing. However, such adjustments normally change the film property and narrow the process window. As specifications for the semiconductor devices become more and more complicated, the requirement for the thickness uniformity of the thin film tends to be more and more rigid as well. Thus it is important to improve the thickness uniformity of the thin film without changing the film property.

SUMMARY OF THE INVENTION

It is therefore a primary object of the present invention to provide a method of using a precursor A to form a thin film on a semiconductor wafer so as to improve the thickness uniformity of the thin film.

According to the claimed invention, a surface of a semiconductor wafer has at least a first region, containing an inner portion of the wafer, and a second region, containing an outer portion of the wafer, and slopes outward from the first region to the second region. An in-situ inert gas plasma treatment is performed on the surface of the semiconductor wafer to generate different temperatures from the first region to the second region. Different deposition rates of the precursor A from the first region to the second region are thus formed so as to form the flat surface. A precursor A-chemical vapor deposition (CVD) process is performed immediately after performing the inert gas plasma treatment so as to form the thin film with the flat surface.

It is an advantage of the present invention against the prior art that a temperature gradient is formed from the first region to the second region so as to generate different deposition rates of the precursor A from the first region to the second region. The defective thickness uniformity of the thin film is thus improved without changing the film property. Consequently, the yield rates of subsequent processes and the reliability of the product are both significantly improved without narrowing the process window.

These and other objectives of the present invention will no doubt become obvious to those of ordinary skill in the art after reading the following detailed description of the preferred embodiment, which is illustrated in the figures and drawings.

DETAILED DESCRIPTION OF THE PREFERRED EMBODIMENT

Figure 1:
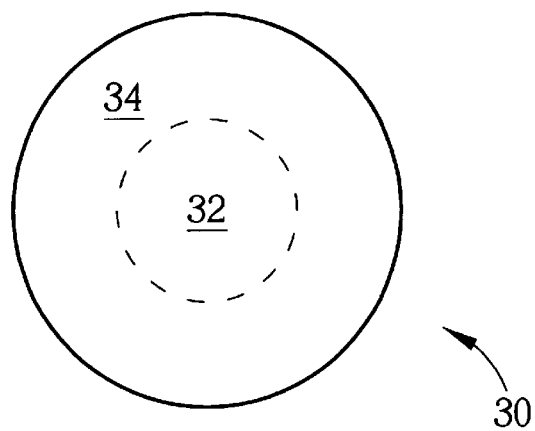
FIG. 1 to FIG. 3 are schematic views of forming a thin film on a semiconductor wafer according to the present invention.
Figure 2:
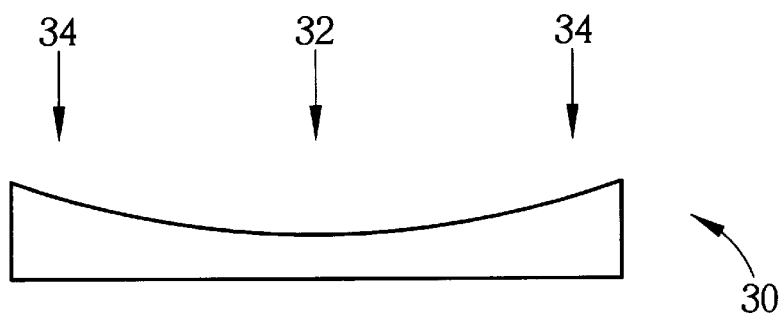
Figure 3:
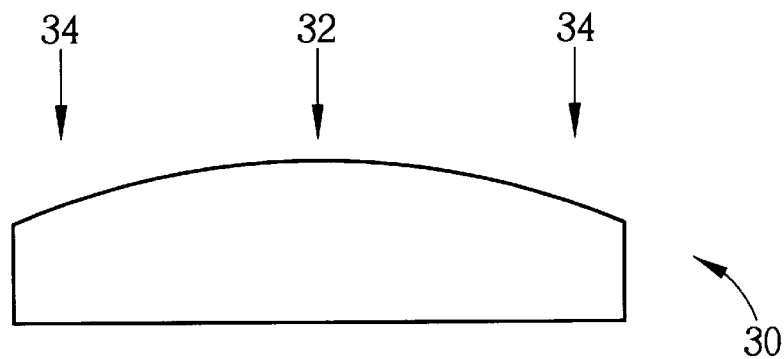

Please refer to FIG. 1 to FIG. 3 of schematic views of forming a thin film on a semiconductor wafer according to the present invention. As shown in FIG. 1, a semiconductor wafer 30 comprises a first region 32, comprising an inner portion of the semiconductor wafer 30, and a second region 34, comprising an outer portion of the semiconductor wafer 30. In addition, as shown in FIG. 2, the first region 32 slopes up to the second region 34 so that the semiconductor wafer 30 has a concave profile.

At the beginning of the method, an in-situ inert gas plasma treatment, with a radio frequency power (RF power) ranging from 0.5 to 1.5 $W/cm^2$ and using an ammonia ($NH_3$) plasma with a flow rate ranging from 2500 to 5000 standard cubic centimeters per minute (sccm), is performed on a surface of the semiconductor wafer 30 at a pressure lower than 2 Torrs. A temperature gradient from the first region 32 to the second region 34 is thus generated so that the temperature of the first region 32 is lower than that of the second region 34.

Then a precursor A-plasma enhanced chemical vapor deposition (PECVD) process is immediately performed after performing the inert gas plasma treatment, to form a thin film, composed of low k (low dielectric constant) materials, with a flat surface, having a uniformity of less than 1.3% (±1σ). Wherein both the in-situ inert gas plasma treatment and the precursor A-PECVD process are performed in the same chamber, and the deposition rate of the precursor A, comprising tetra-ethyl-ortho-silicate (TEOS), tri-methyl silane (3MS), tetra-methyl silane (4MS) or tetra-methyl cyclo tetra-siloxane (TMCTS), decreases as the temperature increases. Since the surface temperature of the first region 32 is lower than that of the second region 34, the deposition rate of the precursor A is higher in the first region 32 than in the second region 34. The defective thickness uniformity of the thin film caused by the slope from the first region 32 up to the second region 34 is thus improved by the formation of the flat surface.

As shown in FIG. 3, in another embodiment of the present invention, the first region 32 slopes down to the second region 34 so that the semiconductor wafer 30 has a convex profile. The in-situ inert gas plasma treatment is performed on the surface of the semiconductor wafer 30 at an alternative pressure of higher than 8 Torrs. A temperature gradient from the first region 32 to the second region 34 is thus generated so that the temperature of the first region 32 is higher than that of the second region 34. Then a precursor A-PECVD process is immediately performed after performing the inert gas plasma treatment so as to form a thin film with a flat surface, having a uniformity of less than 1.3% (±1σ). Wherein the deposition rate of the precursor A, comprising TEOS, 3MS, 4MS or TMCTS, decreases as the temperature increases. Since the surface temperature of the first region 32 is higher than that of the second region 34, the deposition rate of the precursor A is lower in the first region 32 than in the second region 34. The defective thickness uniformity of the thin film caused by the slope from the first region 32 down to the second region 34 is thus improved by the formation of the flat surface.

In another embodiment of the present invention, the first region 32 sloping down to the second region 34 so that the semiconductor wafer 30 has a convex profile. The in-situ inert gas plasma treatment is performed on the surface of the semiconductor wafer 30 at an alternative pressure of lower than 2 Torrs. A temperature gradient from the first region 32 to the second region 34 is thus generated so that the temperature of the first region 32 is lower than that of the second region 34. Then aprecursor A-PECVD process is immediately performed after performing the inert gas plasma treatment so as to form a thin film with a flat surface, having a uniformity of less than 1.3% (±1σ). Wherein the deposition rate of the precursor A, comprising silane ($SiH_4$), increases as the temperature increases. Since the surface temperature of the first region 32 is lower than that of the second region 34, the deposition rate of the precursor A is lower in the first region 32 than in the second region 34. The defective thickness uniformity of the thin film caused by the slope from the first region 32 down to the second region 34 is thus improved by the formation of the flat surface.

In another embodiment of the present invention, the first region 32 slopes up to the second region 34 so that the semiconductor wafer 30 has a concave profile. The in-situ inert gas plasma treatment is performed on the surface of the semiconductor wafer 30 at an alternative pressure of higher than 8 Torrs. A temperature gradient from the first region 32 to the second region 34 is thus generated so that the temperature of the first region 32 is higher than that of the second region 34. Then aprecursor A-PECVD process is immediately performed after performing the inert gas plasma treatment to form a thin film with a flat surface, having a uniformity of less than 1.3% (±1σ). Wherein the deposition rate of the precursor A, comprising $SiH_4$, increases as the temperature increases. Since the surface temperature of the first region 32 is higher than that of the second region 34, the deposition rate of the precursor A is higher in the first region 32 than in the second region 34. The defective thickness uniformity of the thin film caused by the slope from the first region 32 up to the second region 34 is thus improved by the formation of the flat surface.

In comparison with the compensating method of adjusting parameters of the PECVD process, including gas flow rate, pressure or showerhead spacing, according to the prior art, a temperature gradient is formed from the first region 32 to the second region 34 in the present invention. Different deposition rates of the precursor A from the first region 32 to the second region 34 are thus generated. The defective thickness uniformity of the thin film caused by the slope from the first region 32 to the second region 34 is thus improved without narrowing the process window or changing the film property. Consequently, the yield rates of subsequent processes and the reliability of the product are both significantly improved.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of forming a thin film on a surface of a semiconductor wafer, the surface having an inner portion and an outer portion, the surface sloping outward from the inner portion to the outer portion, the method comprising:

performing an in-situ inert gas plasma treatment on the surface of the semiconductor wafer to generate different temperatures from the inner portion to the outer portion; and performing a precursor A-chemical vapor deposition (CVD) process immediately after performing the inert gas plasma treatment to form the thin film with a flat surface;

wherein the different temperatures will generate different deposition rates of the precursor A from the inner portion to the outer portion so as to form the flat surface.

2. The method of claim 1 wherein the CVD process is a plasma enhanced chemical vapor deposition (PECVD) process.

3. The method of claim 1 wherein both the in-situ inert gas plasma treatment and the precursor A-CVD process are performed in the same chamber.

4. The method of claim 1 wherein the flat surface of the thin film has a uniformity of less than 1.3%.

5. The method of claim 1 wherein the thin film is composed of low k (low dielectric constant) materials.

6. The method of claim 1 wherein a deposition rate of the precursor A decreases as the temperature increases.

7. The method of claim 6 wherein the precursor A includes tetra-ethyl-ortho-silicate (TEOS), tri-methyl silane (3MS), tetra-methyl silane (4MS) or tetra-methyl cyclo tetra-siloxane (TMCTS).

8. The method of claim 6 wherein if the inner portion slopes up to the outer portion, the in-situ inert plasma treatment is performedat a pressure lower than 2 Torrs.

9. The method of claim 6 wherein if the inner portion slopes down to the outer portion, the in-situ inert plasma treatment is performed at a pressure higher than 8 Torrs.

10. The method of claim 1 wherein a deposition rate of the precursor A increases with the temperature.

11. The method of claim 10 wherein the precursor A includes silane ($SiH_4$).

12. The method of claim 10 wherein if the inner portion slopes up to the outer portion, the in-situ inert plasma treatment is performed at a pressure lower than 2 Torrs.

13. The method of claim 10 wherein if the inner portion slopes down to the outer portion, the in-situ inert plasma treatment is performed at a pressure higher than 8 Torrs.

14. A method of forming a thin film on a surface of a semiconductor wafer, the surface sloping outward from a center of the surface, the method comprising:

positioning the semiconductor wafer in a sealed chamber;

injecting an inert gas into the chamber to form an inert gas plasma on the surface of the semiconductor wafer under a predetermined pressure so as to generate different temperatures on the surface of the semiconductor wafer;

evacuating the sealed chamber; and injecting a reactant comprising precursor A into the sealed chamber and performing a precursor A-PECVD process on the surface of the semiconductor wafer so as to form the thin film with a flat surface;

wherein the different temperatures will generate different deposition rates of the precursor A on the surface of the semiconductor wafer so as to form the flat surface.

15. The method of claim 14 wherein the surface of the semiconductor wafer slopes up from the center to an edge of the semiconductor wafer.

16. The method of claim 14 wherein the thin film has a uniformity of less than 1.3%.

17. The method of claim 14 wherein the deposition rate of the precursor A decreases as the temperature increases.

18. The method of claim 17 wherein the precursor A includes TEOS, 3MS, 4MS or TMCTS.

19. The method of claim 14 wherein the predetermined pressure is lower than 2 Torrs.

* * * * *